US011423923B2

(12) United States Patent
Hedelin et al.

(10) Patent No.: US 11,423,923 B2
(45) Date of Patent: *Aug. 23, 2022

(54) COMPANDING SYSTEM AND METHOD TO REDUCE QUANTIZATION NOISE USING ADVANCED SPECTRAL EXTENSION

(71) Applicants: DOLBY INTERNATIONAL AB, Amsterdam Zuidoost (NL); DOLBY LABORATORIES LICENSING CORPORATION, San Francisco, CA (US)

(72) Inventors: Per Hedelin, Gothenburg (SE); Arijit Biswas, Schwaig bei Nuernberg (DE); Michael Schug, Erlangen (DE); Vinay Melkote, Bangalore (IN)

(73) Assignees: DOLBY LABORATORIES LICENSING CORPORATION, San Francisco, CA (US); DOLBY INTERNATIONAL AB, Amsterdam (NL)

(*) Notice: Subject to any disclaimer, the term of this patent is extended or adjusted under 35 U.S.C. 154(b) by 115 days.

This patent is subject to a terminal disclaimer.

(21) Appl. No.: 16/892,180

(22) Filed: Jun. 3, 2020

(65) Prior Publication Data

US 2020/0395031 A1 Dec. 17, 2020

Related U.S. Application Data

(63) Continuation of application No. 16/457,726, filed on Jun. 28, 2019, now Pat. No. 10,679,639, which is a (Continued)

(51) Int. Cl.
*G10L 19/00* (2013.01)
*G10L 21/00* (2013.01)
(Continued)

(52) U.S. Cl.
CPC ........ *G10L 21/0232* (2013.01); *G10L 19/008* (2013.01); *G10L 19/0208* (2013.01);
(Continued)

(58) Field of Classification Search
None
See application file for complete search history.

(56) References Cited

U.S. PATENT DOCUMENTS 7,299,174 B2   11/2007   Sato
7,558,391 B2   7/2009    Bizjak
(Continued)

FOREIGN PATENT DOCUMENTS

CN   1250293   4/2000
CN   1273662   11/2000
(Continued)

OTHER PUBLICATIONS

Hartmann, W.M. et al "Noise Power Fluctuations and the Masking of Sine Signals" JASA 1988.
(Continued)

*Primary Examiner* — Satwant K Singh

(57) ABSTRACT

Embodiments are directed to a companding method and system for reducing coding noise in an audio codec. A compression process reduces an original dynamic range of an initial audio signal through a compression process that divides the initial audio signal into a plurality of segments using a defined window shape, calculates a wideband gain in the frequency domain using a non-energy based average of frequency domain samples of the initial audio signal, and applies individual gain values to amplify segments of relatively low intensity and attenuate segments of relatively high intensity. The compressed audio signal is then expanded back to the substantially the original dynamic range that applies inverse gain values to amplify segments of relatively
(Continued)

high intensity and attenuating segments of relatively low intensity. A QMF filterbank is used to analyze the initial audio signal to obtain a frequency domain representation.

10 Claims, 7 Drawing Sheets

Related U.S. Application Data continuation of application No. 15/915,405, filed on Mar. 8, 2018, now Pat. No. 10,373,627, which is a continuation of application No. 14/762,690, filed as application No. PCT/US2014/032578 on Apr. 1, 2014, now Pat. No. 9,947,335.

(60) Provisional application No. 61/877,167, filed on Sep. 12, 2013, provisional application No. 61/809,028, filed on Apr. 5, 2013.

(51) Int. Cl.
    *G10L 21/0232* (2013.01)
    *H04B 1/66* (2006.01)
    *G10L 25/18* (2013.01)
    *G10L 21/034* (2013.01)
    *G10L 19/008* (2013.01)
    *G10L 19/02* (2013.01)
    *G10L 19/032* (2013.01)
    *H03G 7/00* (2006.01)
    *G10L 25/45* (2013.01)

(52) U.S. Cl.
    CPC .......... *G10L 19/032* (2013.01); *G10L 21/034* (2013.01); *G10L 25/18* (2013.01); *H04B 1/66* (2013.01); *G10L 25/45* (2013.01); *H03G 7/007* (2013.01)

(56) References Cited

U.S. PATENT DOCUMENTS

| | | | |
|---|---|---|---|
| 7,876,966 B2 | 1/2011 | Ojanpera | |
| 8,447,620 B2 | 5/2013 | Neuendorf | |
| 8,616,516 B2 | 12/2013 | Rittner | |
| 8,626,516 B2 | 1/2014 | Zeng | |
| 8,793,126 B2 | 7/2014 | Gao | |
| 8,913,754 B2 * | 12/2014 | McClain | H03G 9/025 381/106 |
| 8,964,993 B2 * | 2/2015 | Fairey | H04S 7/30 381/17 |
| 9,947,335 B2 | 4/2018 | Hedelin | |
| 10,217,476 B2 | 2/2019 | Hedelin | |
| 10,373,627 B2 * | 8/2019 | Hedelin | G10L 19/008 |
| 10,679,639 B2 * | 6/2020 | Hedelin | G10L 25/18 |
| 2008/0312758 A1 | 12/2008 | Koishida | |
| 2010/0204996 A1 | 8/2010 | Zeng | |
| 2011/0002266 A1 | 1/2011 | Gao | |
| 2011/0058686 A1 | 3/2011 | Toraichi | |
| 2011/0173009 A1 | 7/2011 | Fuchs | |
| 2011/0178795 A1 | 7/2011 | Bayer | |
| 2011/0238425 A1 | 9/2011 | Neuendorf | |
| 2011/0257979 A1 | 10/2011 | Gao | |
| 2011/0257982 A1 | 10/2011 | Smithers | |
| 2011/0257984 A1 | 10/2011 | Virette | |
| 2013/0195276 A1 | 8/2013 | Ojala | |
| 2018/0197561 A1 | 7/2018 | Hedelin | |

FOREIGN PATENT DOCUMENTS

| | | |
|---|---|---|
| CN | 1354873 A | 6/2002 |
| CN | 1677492 A | 10/2005 |
| CN | 1748443 A | 3/2006 |
| CN | 101064106 | 10/2007 |
| CN | 101067931 | 11/2007 |
| CN | 101079266 | 11/2007 |
| CN | 101084697 | 12/2007 |
| CN | 101089951 | 12/2007 |
| CN | 101165778 | 4/2008 |
| CN | 101178898 | 5/2008 |
| CN | 101262530 | 9/2008 |
| CN | 101281747 | 10/2008 |
| CN | 101305423 | 11/2008 |
| CN | 101335000 | 12/2008 |
| CN | 101335002 | 12/2008 |
| CN | 101359902 | 2/2009 |
| CN | 101366081 | 2/2009 |
| CN | 101388216 | 3/2009 |
| CN | 101512899 | 8/2009 |
| CN | 101521014 | 9/2009 |
| CN | 101529501 | 9/2009 |
| CN | 101529929 A | 9/2009 |
| CN | 101656580 | 2/2010 |
| CN | 101668303 | 3/2010 |
| CN | 101681625 | 3/2010 |
| CN | 101727910 | 6/2010 |
| CN | 101800520 | 8/2010 |
| CN | 101853666 | 10/2010 |
| CN | 101867809 | 10/2010 |
| CN | 101878504 | 11/2010 |
| CN | 101903944 | 12/2010 |
| CN | 101916567 | 12/2010 |
| CN | 101925950 | 12/2010 |
| CN | 102089808 | 6/2011 |
| CN | 102099857 | 6/2011 |
| CN | 102318189 | 1/2012 |
| CN | 102361506 | 2/2012 |
| CN | 102522092 | 6/2012 |
| CN | 102543086 | 7/2012 |
| CN | 102549659 | 7/2012 |
| CN | 102625220 | 8/2012 |
| CN | 102656627 | 9/2012 |
| CN | 102737647 | 10/2012 |
| CN | 102792374 | 11/2012 |
| EP | 1533791 | 4/2008 |
| EP | 2002429 | 12/2008 |
| EP | 2317509 | 5/2011 |
| JP | 05292592 | 11/1993 |
| JP | 11234137 | 8/1999 |
| JP | 2003005797 | 1/2003 |
| JP | 2004289762 | 10/2004 |
| JP | 2009532739 | 9/2009 |
| JP | 2009288354 | 12/2009 |
| JP | 2010212887 | 9/2010 |
| JP | 6026678 | 10/2016 |
| RU | 2347282 | 2/2009 |
| RU | 2438197 | 12/2011 |
| RU | 2439717 C1 | 1/2012 |
| RU | 2468451 | 11/2012 |
| WO | 0036754 | 6/2000 |
| WO | 2007081752 | 7/2007 |
| WO | 2010140940 A1 | 12/2010 |
| WO | 2011127832 | 10/2011 |
| WO | 2011158485 | 12/2011 |

OTHER PUBLICATIONS

Lam, Yin H. "Digital Filtering for Audio Coding" IEEE Colloquium on Digital Filters: An Enabling Technology, Apr. 20, 1998, pp. 10/1-1011.

Lefebvre, R. et al "Shaping Coding Noise with Frequency-Domain Companding" IEEE Workshop on Speech Coding for Telecommunications Proceeding, Sep. 7-10, 1997, pp. 61-62.

Liu, Chi-Min, et al "Compression Artifacts in Perceptual Audio Coding" IEEE Transactions on Audio, Speech, and Language Processing, vol. 16, No. 4, May 2008, pp. 681-695.

Riedmiller, Jeffrey C. "An Analysis of Audio for Digital Cable Television Recommendations for the Digital Transition via Audio Metadata" pp. 1-18, 2001.

Saito, S. et al "A Data Hiding for Audio Using Band Division Based on QMF Bank" IEEE International Symposium on Circuits and Systems, May 26-29, 2002, pp. 635-638, vol. 3.

(56) References Cited

OTHER PUBLICATIONS

Saramaki, T. et al "Multirate Systems and Filter Banks" Signal Processing Laboratory, University of Technology, Tampere, Finland, 1993.
Seefeldt, et al. "Loudness Domain Signal Processing" AES Convention, Oct. 2007.
HYBRID-MELP/CELP, pp. 136-141, Jul. 2005, pp. 1-27.
Lee, Y.H. et al "Entropy Coding of Compressed Feature Parameters for Distributed Speech Recognition" May 2010, pp. 405-412, vol. 52, Issue 5.
Wang, Y. et al "Acoustic and Perceptual evaluation of Mandarin Tone Productions before and after Perceptual Training" Mar. 2003, pp. 1033-1043, pp. 1-18.

\* cited by examiner

COMPANDING SYSTEM AND METHOD TO REDUCE QUANTIZATION NOISE USING ADVANCED SPECTRAL EXTENSION

CROSS-REFERENCE TO RELATED APPLICATIONS

This application is a continuation of U.S. patent application Ser. No. 16/457,726, filed Jun. 28, 2019, which is a continuation of U.S. patent application Ser. No. 15/915,405, filed Mar. 8, 2018, now U.S. Pat. No. 10,373,627, which is a continuation of Ser. No. 14/762,690, filed Jul. 22, 2015, now U.S. Pat. No. 9,947,335, which is the U.S. National Stage application of the International Application No. PCT/US2014/032578, filed Apr. 1, 2014, which claims priority to U.S. Provisional Application Nos. 61/809,028, filed Apr. 5, 2013 and 61/877,167, filed Sep. 12, 2013, each of which is hereby incorporated by reference in its entirety.

FIELD OF THE INVENTION

One or more embodiments relate generally to audio signal processing, and more specifically to reducing coding noise in audio codecs using compression/expansion (companding) techniques.

BACKGROUND

Many popular digital sound formats utilize lossy data compression techniques that discard some of the data to reduce storage or data rate requirements. The application of lossy data compression not only reduces the fidelity of source content (e.g., audio content), but it can also introduce noticeable distortion in the form of compression artifacts. In the context of audio coding systems, these sound artifacts are called coding noise or quantization noise.

Digital audio systems employ codecs (coder-decoder components) to compress and decompress audio data according to a defined audio file format or streaming media audio format. Codecs implement algorithms that attempt to represent the audio signal with a minimum number of bits while retaining as high a fidelity as possible. The lossy compression techniques typically used in audio codecs work on a psychoacoustic model of human hearing perception. The audio formats usually involve the use of a time/frequency domain transform (e.g., a modified discrete cosine transform—MDCT), and use masking effects, such as frequency masking or temporal masking so that certain sounds, including any apparent quantization noise is hidden or masked by actual content.

Most audio coding systems are frame based. Within a frame, audio codecs normally shape the coding noise in the frequency domain so that it becomes least audible. Several present digital audio formats utilize frames of such long durations that a frame may contain sounds of several different levels or intensities. Since the coding noise is usually stationary in level over the evolution of a frame, coding noise may be most audible during low intensity parts of the frame. Such an effect may be manifested as pre-echo distortion in which silence (or low-level signal) preceding a high intensity segment is swamped by noise in the decoded audio signal. Such an effect may be most noticeable in transient sounds or impulses from percussion instruments, such as castanets or other sharp percussive sound sources. Such distortion is typically caused by the quantization noise introduced in the frequency domain being spread over the entire transform window of the codec in the time domain.

Present measures to avoid or minimize pre-echo artifacts include the use of filters.

Such filters, however, introduce phase distortion and temporal smearing. Another possible solution includes the use of smaller transform windows, however this approach can significantly reduce frequency resolution.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are directed to a method of processing a received audio signal by expanding the audio signal to an expanded dynamic range through a process that includes dividing the received audio signal into a plurality of time segments using a defined window shape, calculating a wideband gain for each time segment in the frequency domain using a non-energy based average of a frequency domain representation of the audio signal, and applying the gain value to each time segment to obtain the expanded audio signal. The gain values of the wideband gain applied to each time segment are selected to have the effect of amplifying segments of relatively high intensity and attenuating segments of relatively low intensity. For this method, the received audio signal comprises an original audio signal that was compressed from an original dynamic range through a compression process including dividing the original audio signal into a plurality of time segments using a defined window shape, calculating a wideband gain in the frequency domain using a non-energy based average of frequency domain samples of the initial audio signal, and applying the wideband gain to the original audio signal. In the compression process, the gain values of the wideband gain applied to each time segment are selected to have the effect of amplifying segments of relatively low intensity and attenuating segments of relatively high intensity. The expansion process is configured to substantially restore the dynamic range of the initial audio signal, and the wideband gain of the expansion process may be substantially the inverse of the wideband gain of the compression process.

In a system that implements a method of processing a received audio signal by an expansion process, a filterbank component may be used to analyze the audio signal to obtain its frequency domain representation, and the defined window shape for segmentation into the plurality of time segments may be the same as the prototype filter for the filterbank.

Likewise, in a system that implements a method of processing a received audio signal by a compression process, a filterbank component may be used to analyze the original audio signal to obtain its frequency domain representation, and the defined window shape for segmentation into the plurality of time segments may be the same as the prototype filter for the filterbank. The filterbank in either case may be one of a QMF bank or a short-time Fourier transform. In this system, a received signal for the expansion process is obtained after modification of the compressed signal by an audio encoder that generates a bitstream, and a decoder that decodes the bitstream. The encoder and decoder may comprise at least part of a transform-based audio codec.

The system may further comprise components that process control information that is received through the bitstream and determines an activation state of the expansion process.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Systems and methods are described for the use of companding techniques to achieve temporal noise shaping of quantization noise in an audio codec. Such embodiments include the use of a companding algorithm implemented in the QMF-domain to achieve temporal shaping of quantization noise. Processes include encoder control of the desired decoder companding level, and extension beyond monophonic applications to stereo and multi-channel companding.

Aspects of the one or more embodiments described herein may be implemented in an audio system that processes audio signals for transmission across a network that includes one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Figure 1:
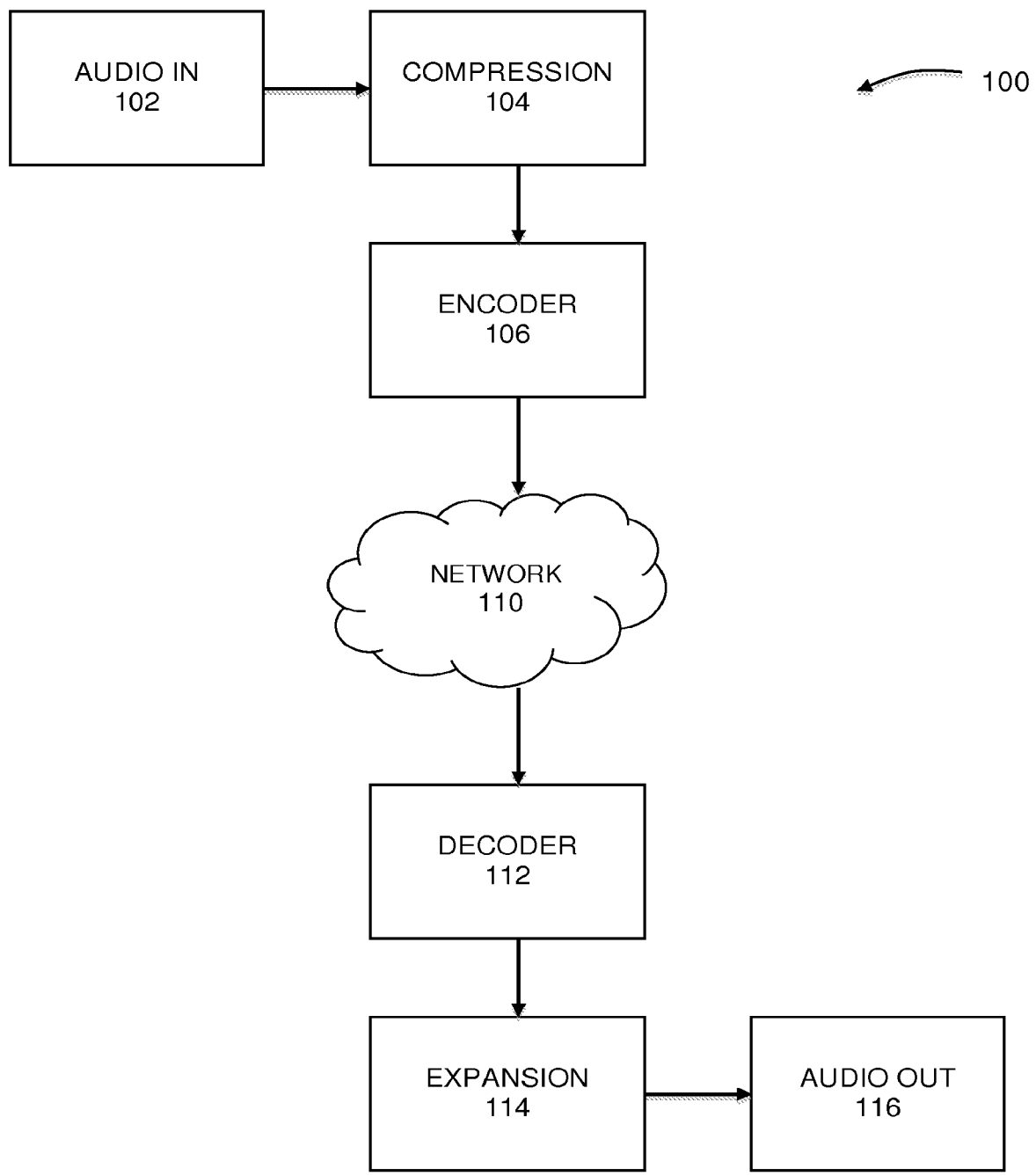
FIG. 1 illustrates a system for compressing and expanding an audio signal in a transform-based audio codec, under an embodiment.

FIG. 1 illustrates a companding system for reducing quantization noise in a codec-based audio processing system, under an embodiment. FIG. 1 illustrates an audio signal processing system that is built around an audio codec comprising encoder (or "core encoder") 106 and decoder (or "core decoder") 112. The encoder 106 encodes audio content into data stream or signal for transmission over network 110 where it is decoded by decoder 112 for playback or further processing. In an embodiment, the encoder 106 and decoder 112 of the codec implement a lossy compression method to reduce the storage and/or data rate requirements of the digital audio data, and such a codec may be implemented as a MP3, Vorbis, Dolby Digital (AC-3), AAC, or similar codec. The lossy compression method of the codec creates coding noise that generally is stationary in level over the evolution of a frame defined by the codec. Such coding noise is often most audible during low intensity parts of a frame. System 100 includes components that reduce the perceived coding noise in existing coding systems by providing a compression pre-step component 104 prior to the core encoder 106 of the codec and an expansion post-step component 114 operating on the core decoder 112 output. The compression component 104 is configured to divide the original audio input signal 102 into a plurality of time segments using a defined window shape, calculate and apply a wideband gain in the frequency domain using a non-energy based average of frequency domain samples of the initial audio signal, wherein the gain values applied to each time segment amplify segments of relatively low intensity and attenuate segments of relatively high intensity. This gain modification has the effect of compressing or significantly reducing the original dynamic range of the input audio signal 102. The compressed audio signal is then coded in encoder 106, transmitted over network 110 and decoded in decoder 112. The decoded compressed signal is input to expansion component 114, which is configured to perform the inverse operation of the compression pre-step 104 by applying inverse gain values to each time segment to expand the dynamic range of the compressed audio signal back to the dynamic range of the original input audio signal 102. Thus, the audio output signal 116 comprises an audio signal having the original dynamic range, with the coding noise removed through the pre- and post-step companding process.

As shown in FIG. 1, a compression component or compression pre-step 104 is configured to reduce the dynamic range of the audio signal 102 input to the core encoder 106. The input audio signal is divided into a number of short segments. The size or length of each short segment is a fraction of the frame size used by the core encoder 106. For example, a typical frame size of the core coder may be on the order of 40 to 80 milliseconds. In this case, each short segment may be on the order of 1 to 3 milliseconds. The compression component 104 calculates an appropriate wideband gain value to compress the input audio signal on a per-segment basis. This is achieved by modifying short segments of the signal by an appropriate gain value for each segment. Relatively large gain values are selected to amplify segments of relatively low intensity, and small gain values are selected to attenuate segments of high intensity.

Figure 2A:
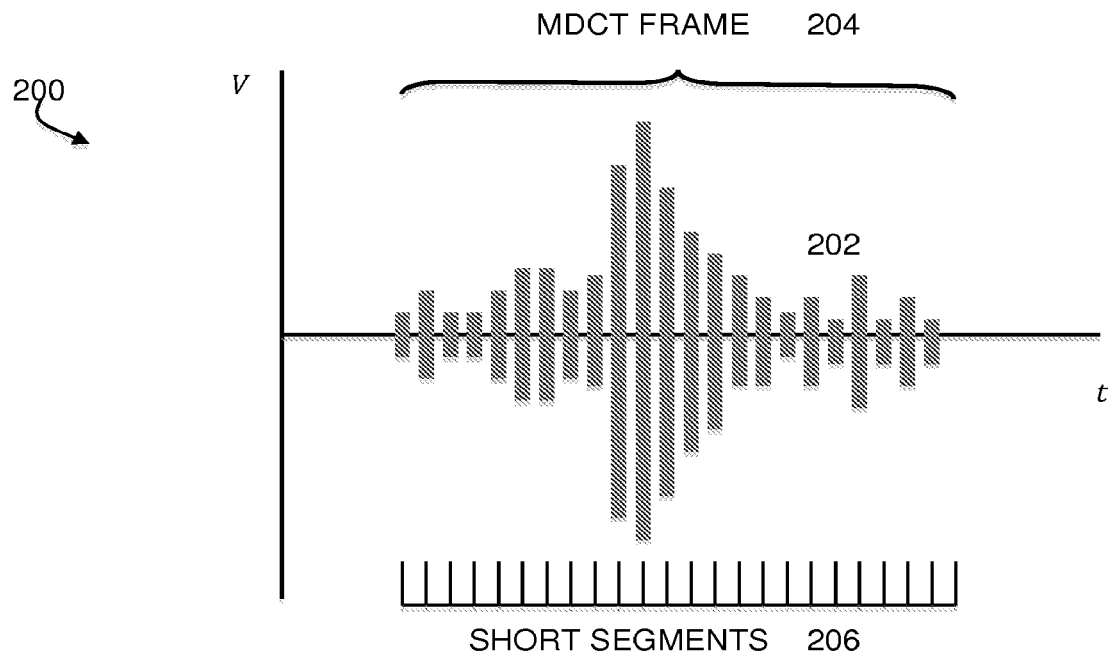
FIG. 2A illustrates an audio signal divided into a plurality of short time segments, under an embodiment.
Figure 2B:
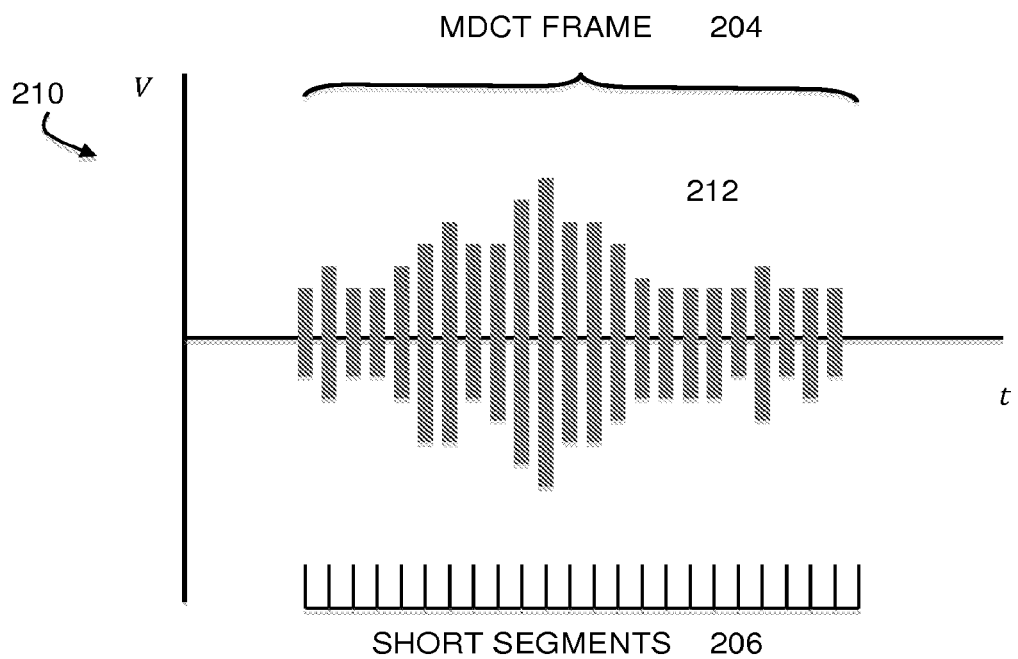
FIG. 2B illustrates the audio signal of FIG. 2A after the application of wideband gain over each of the short time segments, under an embodiment.

FIG. 2A illustrates an audio signal divided into a plurality of short time segments, under an embodiment, and FIG. 2B illustrates the same audio signal after application of wideband gain by a compression component. As shown in FIG. 2A, audio signal 202 represents a transient or sound impulse such as may be produced by a percussive instrument (e.g., castanets). The signal features a spike in amplitude as shown in the plot of voltage, V, versus time, t. In general, the amplitude of the signal is related to the acoustic energy or intensity of the sound and represents a measure of the sound's power at any point in time. When the audio signal 202 is processed through a frame-based audio codec, portions of the signal are processed within transform (e.g., MDCT) frames 204. Typical present digital audio systems utilize frames of relatively long duration, so that for sharp transient or short impulse sounds, a single frame may include sounds of low intensity as well high intensity. Thus, as shown in FIG. 1, the single MDCT frame 204 includes the impulse portion (peak) of the audio signal as well as a relatively large amount of low intensity signal before and after the peak. In an embodiment, a compression component 104 divides the signal into a number of short time segments, 206, and applies a wideband gain to each segment in order to compress the dynamic range of the signal 202. The number and size of each short segment may be selected based on application needs and system constraints. Relative to the size of an individual MDCT frame, the number of short segments may range from 12 to 64 segments, and may typically comprise 32 segments, but embodiments are not so limited.

FIG. 2B illustrates the audio signal of FIG. 2A after the application of wideband gain over each of the short time segments, under an embodiment. As shown in FIG. 2B, audio signal 212 has the same relative shape as the original signal 202, however, the amplitude of the low intensity segments has been increased by application of amplifying gain values, and the amplitude of the high intensity segments has been decreased by application of attenuating gain values.

The output of the core decoder 112 is the input audio signal with reduced dynamic range (e.g., signal 212) plus quantization noise introduced by the core encoder 106. This quantization noise features an almost uniform level across time within each frame. The expansion component 114 acts on the decoded signal to restore the dynamic range of the original signal. It uses the same short time resolution based on the short segment size 206 and inverts the gains applied in the compression component 104. Thus, the expansion component 114 applies a small gain (attenuation) on segments that in the original signal had low intensity, and had been amplified by the compressor, and applies a large gain (amplification) on segments that in the original signal had high intensity and had been attenuated by the compressor. The quantization noise added by the core coder, that had a uniform time envelope, is thus concurrently shaped by the post-processor gain to approximately follow the temporal envelope of the original signal. This processing effectively renders the quantization noise less audible during quiet passages. Although the noise may be amplified during passages of high intensity, it remains less audible due to the masking effect of the loud signal of the audio content itself.

As shown in FIG. 2A, the companding process modifies discrete segments of the audio signal individually with respective gain values. In certain cases, this can result in discontinuities at the output of the compression component that can cause problems in the core encoder 106. Likewise, discontinuities in gain at the expansion component 114 could result in discontinuities in the envelope of the shaped noise, which could result in audible clicks in the audio output 116. Another issue related to application of individual gain values to short segments of the audio signal is based on the fact that typical audio signals are a mixture of many individual sources. Some of these sources may be stationary across time, and some may be transients. A stationary signal is generally constant in their statistical parameters over time, whereas transient signals are generally not constant. Given the broadband nature of transients, their fingerprint in such a mixture is usually more visible at the higher frequencies. A gain calculation that is based on the short-term energy (RMS) of the signal tends to be biased towards the stronger low frequencies and hence is dominated by the stationary sources, and exhibits little variation across time. Thus, this energy-based approach is generally ineffective in shaping the noise introduced by the core encoder.

In an embodiment, system 100 calculates and applies the gain at the compression and expansion components in a filter-bank with a short prototype filter in order to resolve the potential issues associated with the application of individual gain values. The signal to be modified (the original signal at the compression component 104, and the output of the core decoder 112 in the expansion component 114) is first analyzed by the filter-bank and the wideband gain is applied directly in the frequency domain. The corresponding effect in the time domain is to naturally smooth the gain application according to the shape of the prototype filter. This resolves the issues of discontinuities described above. The modified frequency domain signal is then converted back to the time domain via a corresponding synthesis filter-bank. Analyzing the signal with a filterbank provides access to its spectral content, and allows the calculation of a gain that preferentially boosts the contribution due to the high frequencies (or to boost the contribution due to any spectral content that is weak), providing gain values that are not dominated by the strongest components in the signal. This resolves the problem associated with audio sources that comprise a mixture of different sources, as described above. In an embodiment, the system calculates the gain using a p-norm of the spectral magnitudes where p is typically less than 2 (p<2). This enables more emphasis to the weak spectral content, as compared to when it is based on energy (p=2).

As stated above, the system includes a prototype filter to smooth the gain application. In general, a prototype filter is the basic window shape in a filterbank, which is modulated by sinusoidal waveforms to get the impulse responses for the different subband filters in the filterbanks. For instance, a short-time Fourier transform (STFT) is a filterbank, and each frequency line of this transform is a subband of the filterbank. The short-time Fourier transform is implemented by multiplying a signal with a window shape (an N-sample window), which could be rectangular, Hann, Kaiser-Bessel derived (KBD), or some other shape. The windowed signal is then subject to a discrete Fourier transform (DFT) operation, to obtain the STFT. The window shape in this case is the prototype filter. The DFT is composed of sinusoidal basis functions, each of a different frequency. The window shape multiplied by a sinusoidal function then provides the filter for the subband corresponding to that frequency. Since the window shape is the same at all frequencies, it is referred to as a "prototype".

In an embodiment, the system utilizes a QMF (Quadrature Modulated Filter) bank for the filterbank. In a particular implementation, the QMF bank may have a 64-pt window, which forms the prototype. This window modulated by cosine and sine functions (corresponding to 64 equally spaced frequencies) forms the subband filters for the QMF bank. After each application of the QMF function, the window is moved over by 64 samples, i.e., the overlap between time segments in this case is 640−64=576 samples. However, although the window shape spans ten time segments in this case (640=10*64), the main lobe of the window (where its sample values are very significant) is about 128 samples long. Thus, the effective length of the window is still relatively short.

In an embodiment, the expansion component 114 ideally inverts the gains applied by the compression component 104. Although it is possible to transmit the gains applied by the compression component through the bitstream to the decoder, such an approach would typically consume a significant bit-rate. In an embodiment, system 100 instead estimates the gains required by the expansion component 114 directly from the signal available to it, i.e., the output of the decoder 112, which effectively requires no additional bits. The filterbank at the compression and expansion components are selected to be identical in order to calculate gains that are inverses of each other. In addition, these filterbanks are time synchronized so that any effective delays between the output of the compression component 104 and the input to the expansion component 114 are multiple of the stride of the filterbank. If the core encoder-decoder were lossless, and the filterbank provides perfect reconstruction, the gains at the compression and expansion components would be exact inverses of each other, thus allowing for exact reconstruction of the original signal. In practice, however, the gain applied by the expansion component 114 is only a close approximation of the inverse of the gain applied by the compression component 104.

In an embodiment, the filterbank used in the compression and expansion components is a QMF bank. In a typical use application, a core audio frame could be 4096 samples long with an overlap of 2048 with the neighboring frame. At 48 kHz such a frame would be 85.3 milliseconds long. In contrast, a QMF bank that is used may have a stride of 64 samples (which is 1.3 ms long), which provides a fine temporal resolution for the gains. Further, the QMF has a smooth prototype filter that is 640 samples long ensuring that the gain application varies smoothly across time. Analysis with this QMF filterbank provides a time-frequency tiled representation of the signal. Each QMF time-slot is equal to a stride and in each QMF time-slot there are 64 uniformly spaced subbands. Alternatively, other filterbanks could be employed, such as a short term Fourier transform (STFT), and such a time-frequency tiled representation could still be obtained.

Figure 6:
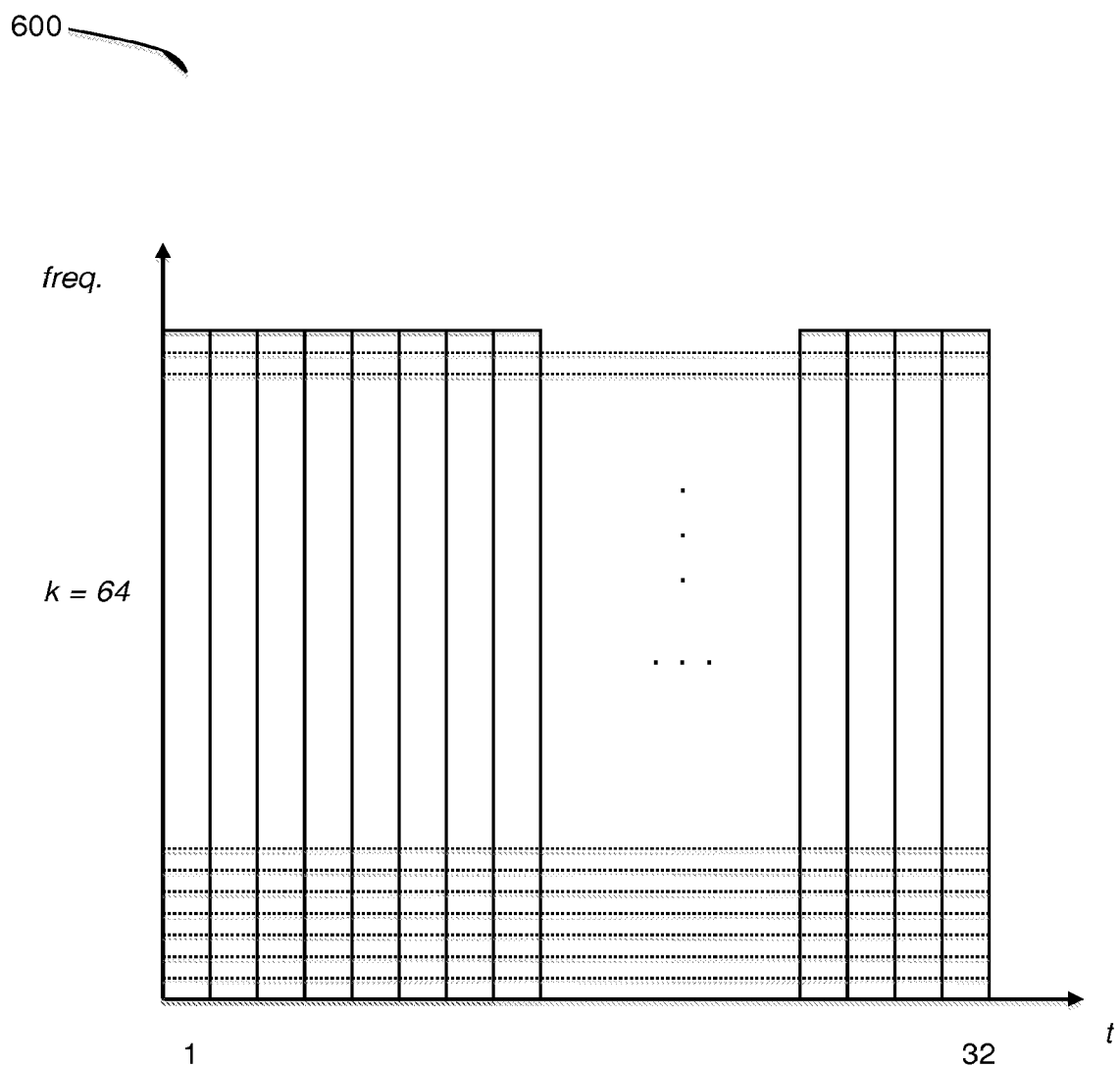
FIG. 6 illustrates the division of an audio signal into a plurality of short time segments, under an embodiment.

In an embodiment, the compression component 104 performs a pre-processing step that scales the codec input. For this embodiment, $S_t(k)$ is a complex valued filter bank sample at time slot t and frequency bin k. FIG. 6 illustrates the division of an audio signal into a number of time slots for a range of frequencies, under an embodiment. For the embodiment of diagram 600, there are 64 frequency bins k, and 32 time slots t that produce a plurality of time-frequency tiles as shown (though not necessarily drawn to scale). The compression pre-steps scales the codec input to become $S'_t(k)=S_t(k)/g_t$. In this equation, $g_t=(\overline{S}_t/S_0)^\gamma$ is a normalized slot mean.

$$\overline{S}_t = \frac{1}{K}\sum_{k=1}^{K}|S_t(k)|$$

In the above equation, the expression, is the mean absolute level/1-norm and $S_0$ is a suitable constant. A generic p-norm is defined in this context as follows:

$$\overline{S}_t = \left(\frac{1}{K}\sum_{k=1}^{K}|S_t(k)|^p\right)^{1/p}$$

It has been shown that the 1-norm may give significantly better results than using the energy (rms/2-norm). The value of the exponent term γ is typically in the range of between 0 and 1, and may be chosen to be ⅓. The constant $S_0$ ensures reasonable gain values independent of the implementation platform. For instance, it may be 1 when implemented in a platform where all the $S_t(k)$ values might be limited in absolute value to 1. It could potentially be different in a platform where $S_t(k)$ may have a different maximum absolute value. It could also be used to make sure that mean gain value across a large set of signals is close to 1. That is, it could be an intermediate signal value between a maximum signal value and a minimum signal value determined from large corpora of content.

In the post-step process performed by the expansion component 114, the codec output is expanded by an inverse gain applied by the compression component 104. This requires an exact or near-exact replica of the filter bank of the compression component. In this case, $\tilde{S}_t(k)$ represents a complex valued sample of this second filter bank. The expansion component 114 scales the codec output to become $\tilde{S}'_t(k)=\tilde{S}_t(k)\cdot\tilde{g}_t$.

In the above equation $\tilde{g}_t$ is a normalized slot mean given as:

$$\tilde{g}_t = (\overline{\tilde{S}}_t/S_0)^{\gamma/(1-\gamma)}$$

and $$\overline{\tilde{S}}_t = \left(\frac{1}{K}\sum_{k=1}^{K}|\tilde{S}_t(k)|^p\right)^{1/p}$$

In general, the expansion component 114 will use the same p-norm as used in the compression component 104. Thus, if the mean absolute level is used to define $\overline{S}_t$ in the compression component 104, $\overline{\tilde{S}}_t$ is also defined using the 1-norm (p=1) in the above equation.

When a complex filterbank (comprising of both cosine and sine basis functions), such as the STFT or the complex-QMF is used in the compression and expansion components, the calculation of the magnitude, $|\tilde{S}_t(k)|$ or $|S_t(k)|$ of a complex subband sample requires a computationally intensive square-root operation. This can be circumvented by approximating the magnitude of the complex subband sample in a variety of ways, for instance, by summing up the magnitude of its real and imaginary parts.

In the above equations, the value K is equal to the number of subbands in the filterbank, or lower. In general, the p-norm could be calculated using any subset of the subbands in the filterbank. However, the same subset should be employed at both the encoder 106 and decoder 112. In an embodiment, the high frequency portions (e.g., audio components above 6 kHz) of the audio signal could be coded with an advanced spectral extension (A-SPX) tool. Additionally, it may be desirable to use only the signal above 1 kHz (or a similar frequency) to guide the noise-shaping. In such a case only those subbands in the range 1 kHz to 6 kHz may be used to calculate p-norm, and hence the gain value. Furthermore, although the gain is calculated from one subset of subbands it could still be applied to a different, and possibly larger, subset of subbands.

Figure 3A:
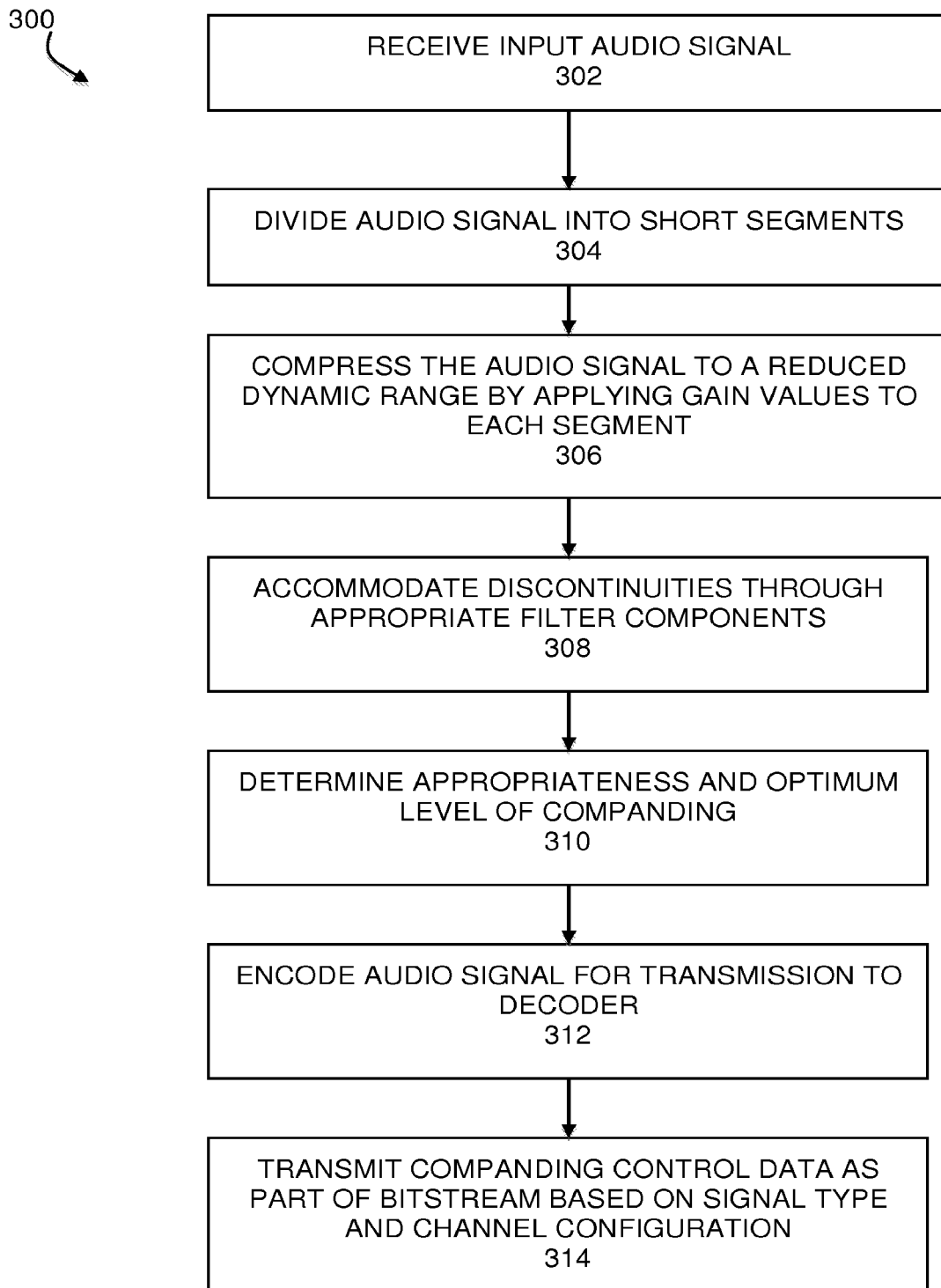
FIG. 3A is a flowchart illustrating a method of compressing an audio signal, under an embodiment.

As shown in FIG. 1, the companding function to shape quantization noise introduced by the core encoder 106 of an audio codec is performed two separate components 104 and 114 performing certain pre-encoder compression functions and post-decoder expansion functions. FIG. 3A is a flowchart illustrating a method of compressing an audio signal in a pre-encoder compression component, under an embodiment, and FIG. 3B is a flowchart illustrating a method of expanding an audio signal in a post-decoder expansion component, under an embodiment.

As shown in FIG. 3A, process 300 begins with the compression component receiving the input audio signal (302). This component then divides the audio signal into short time-segments (304) and compresses the audio signal to a reduced dynamic range by applying wideband gain values to each of the short segments (306). The compression component also implements certain prototype filtering and QMF filterbank components to reduce or eliminate any discontinuities caused by applying different gain values to contiguous segments, as described above (308). In certain cases, such as based on the type of audio content or certain characteristics of the audio content, compression and expansion of the audio signal before and after the encode/decode stages of the audio codec may degrade rather than enhance the output audio quality. In such instances, the companding process may be turned off, or modified to return different companding (compression/expansion) levels. Thus, the compression component determines the appropriateness of the companding function and/or the optimum level of companding required for the specific signal input and audio playback environment, among other variables (310). This determination step 310 may occur at any practical point of process 300, such as prior to the division of the audio signal 304 or the compression of the audio signal 306. If companding is deemed to be appropriate, the gains are applied (306), and the encoder then encodes the signal for transmission to the decoder in accordance with the data format of the codec (312). Certain companding control data, such as activation data, synchronization data, companding level data, and other similar control data may be transmitted as part of the bitstream for processing by the expansion component.

Figure 3B:
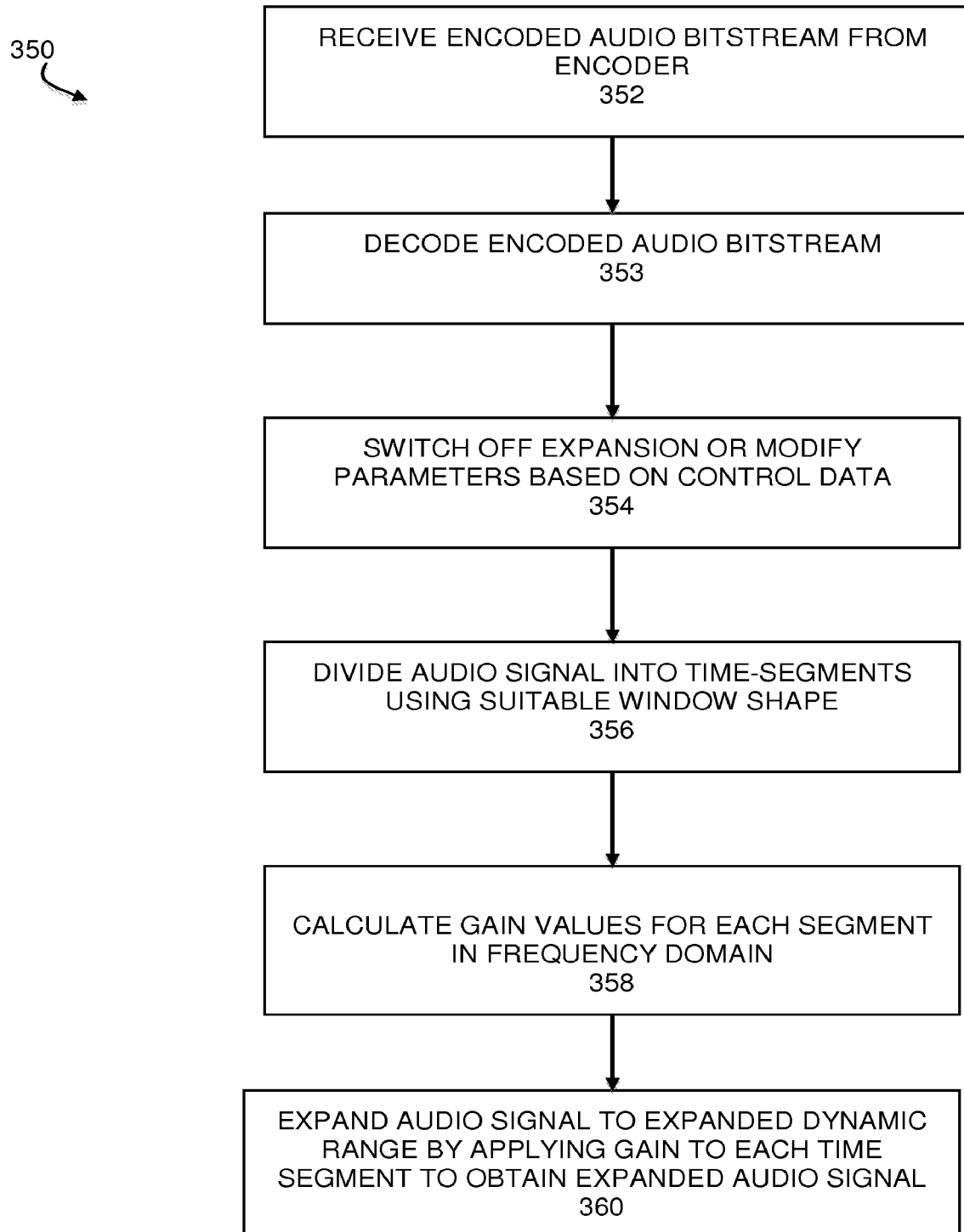
FIG. 3B is a flowchart illustrating a method of expanding an audio signal, under an embodiment.

FIG. 3B is a flowchart illustrating a method of expanding an audio signal in a post-decoder expansion component, under an embodiment. As shown in process 350, the decoder stage of the codec receives the bitstream encoding the audio signal from the encoder stage (352). The decoder then decodes the encoded signal in accordance with the codec data format (353). The expansion component then processes the bitstream and applies any encoded control data to switch off expansion or modify the expansion parameters based on the control data (354). The expansion component divides the audio signal into time segments using a suitable window shape (356). In an embodiment, the time segments correspond to the same time segments used by the compression component. The expansion component then calculates the appropriate gain values for each segment in the frequency domain (358) and applies the gain values to each time segment to expand the dynamic range of the audio signal back to the original dynamic range, or any other appropriate dynamic range (360).

Companding Control

The compression and expansion components comprising the compander of system 100 may be configured to apply the pre and post-processing steps only at certain time during audio signal processing, or only for certain types of audio content. For example, companding may exhibit benefits for speech and musical transient signals. However, for other signals, such as stationary signals companding may degrade the signal quality. Thus, as shown in FIG. 3A, a companding control mechanism is provided as block 310, and control data is transmitted from the compression component 104 to the expansion component 114 to coordinate the companding operation. The simplest form of such a control mechanism is to switch off the companding function for the blocks of audio samples where application of the companding is degrading the audio quality. In an embodiment, the companding on/off decision is detected in the encoder and transmitted as bitstream element to the decoder so that compressor and expander are able to be switched on/off at the same QMF time slot.

The switching between the two states will usually lead to a discontinuity in the applied gain, resulting in audible switching artifacts or clicks. Embodiments include mechanisms to reduce or eliminate these artifacts. In a first embodiment, the system allows switching of the companding function off and on only at frames where the gain is close to 1. In this case, there is only a small discontinuity between switching the companding function on/off. In a second embodiment, a third weak companding mode, that is in between on and off mode is applied in an audio frame between on and off frames, and is signaled in the bitstream. The weak companding mode slowly transitions the exponent term γ from its default value during companding to 0, which is the equivalent of no companding. As an alternative to the intermediate weak companding mode, the system may implement start-frames and stop-frames that over a block of audio samples smoothly fades into an out-of-companding mode instead of abruptly switching off the companding function. In a further embodiment, the system is configured not to simply switch off the companding but rather apply an average gain. In certain cases, the audio quality of tonal-stationary signals can be increased if a constant gain factor is applied to an audio frame that more greatly resembles the gain factors of adjacent companding-on frames than a constant gain factor of 1.0 in a companding off situation. Such a gain factor can be calculated by averaging all companding gains over one frame. A frame containing constant average companding gain is thus signaled in the bitstream.

Although embodiments are described in the context of a monophonic audio channel, it should be noted that in a straightforward extension multiple channels could be handled by repeating the approach individually on each channel. However, audio signals that comprise two or more channels present certain additional complexities that are addressed by embodiments of the companding system of FIG. 1. The companding strategy should depend on the similarity between channels.

For example, in the case of stereo-panned transient signals it has been observed that independent companding of the individual channels may result in audible image artifacts. In an embodiment, the system determines a single gain value for each time-segment from the subband samples of both channels and uses the same gain value to compress/expand the two signals. This approach is generally suitable whenever the two channels have very similar signals, wherein similarity is defined using cross correlation, for instance. A detector calculates the similarity between channels and switches between using individual companding of the channels or jointly companding the channels. Extensions to more channels would divide the channels into groups of channels using similarity criteria and apply joint companding on the groups. This grouping information can then be transmitted through the bitstream.

System Implementation

Figure 4:
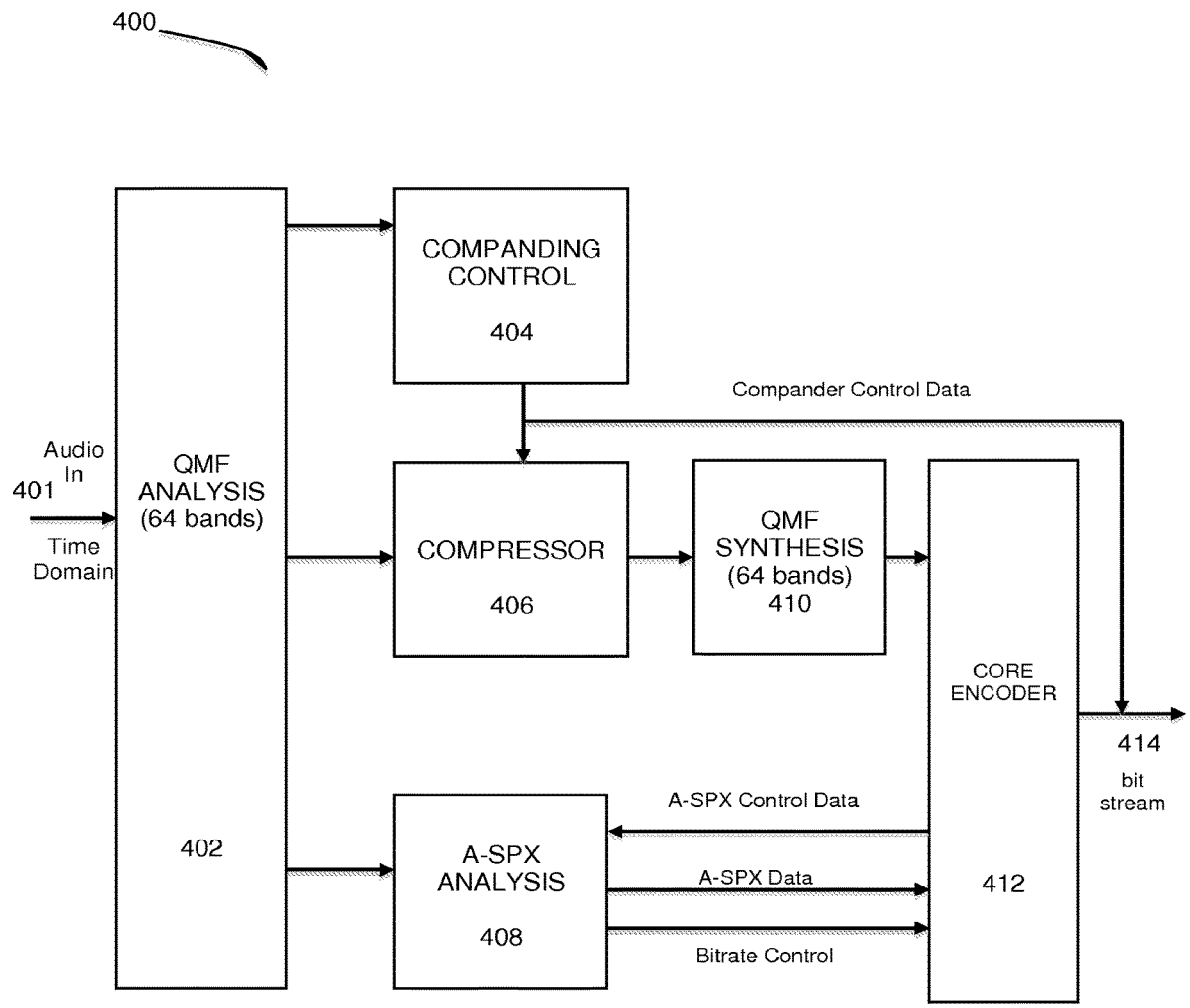
FIG. 4 is a block diagram illustrating a system for compressing an audio signal, under an embodiment.

FIG. 4 is a block diagram illustrating a system for compressing an audio signal in conjunction with an encoder stage of a codec, under an embodiment. FIG. 4 illustrates a hardware circuit or system that implements at least a portion of the compression method for use in a codec-based system shown in FIG. 3A. As shown in system 400, an input audio signal 401 in the time domain is input to a QMF filterbank 402. This filterbank performs an analysis operation that separates the input signal into multiple components in which each bandpass filter carries a frequency sub-band of the original signal. Reconstruction of the signal is performed in a synthesis operation performed by QMF filterbank 410. In the example embodiment of FIG. 4, both the analysis and synthesis filterbanks handle 64 bands. The core encoder 412 receives the audio signal from the synthesis filterbank 410 and generates a bitstream 414 by encoding the audio signal in the appropriate digital format (e.g., MP3, AAC, etc.).

System 400 includes a compressor 406 that applies gain values to each of the short segments that the audio signal has been divided into. This produces a compressed dynamic range audio signal, such as shown in FIG. 2B. A companding control unit 404 analyzes the audio signal to determine whether or how much compression should be applied based on the type of signal (e.g., speech), or the characteristics of the signal (e.g. stationary versus transient), or other relevant parameters. The control unit 404 may include a detection mechanism to detect the temporal peakness characteristic of the audio signal. Based on the detected characteristic of the audio signal and certain pre-defined criteria, the control unit 404 sends appropriate control signals to the compressor 406 to either turn off the compression function or modify the gain values applied to the short segments.

In addition to companding, many other coding tools could also operate in the QMF domain. One such tool is A-SPX (advanced spectral extension), which is shown in block 408 of FIG. 4. A-SPX is a technique that is used to allow perceptually less important frequencies to be coded with a coarser coding scheme than more important frequencies. For example, in A-SPX at the decoder end, the QMF subband samples from the lower frequency may be replicated at the higher frequencies, and the spectral envelope in the high frequency band is then shaped using side information transmitted from the encoder to the decoder.

Figure 5:
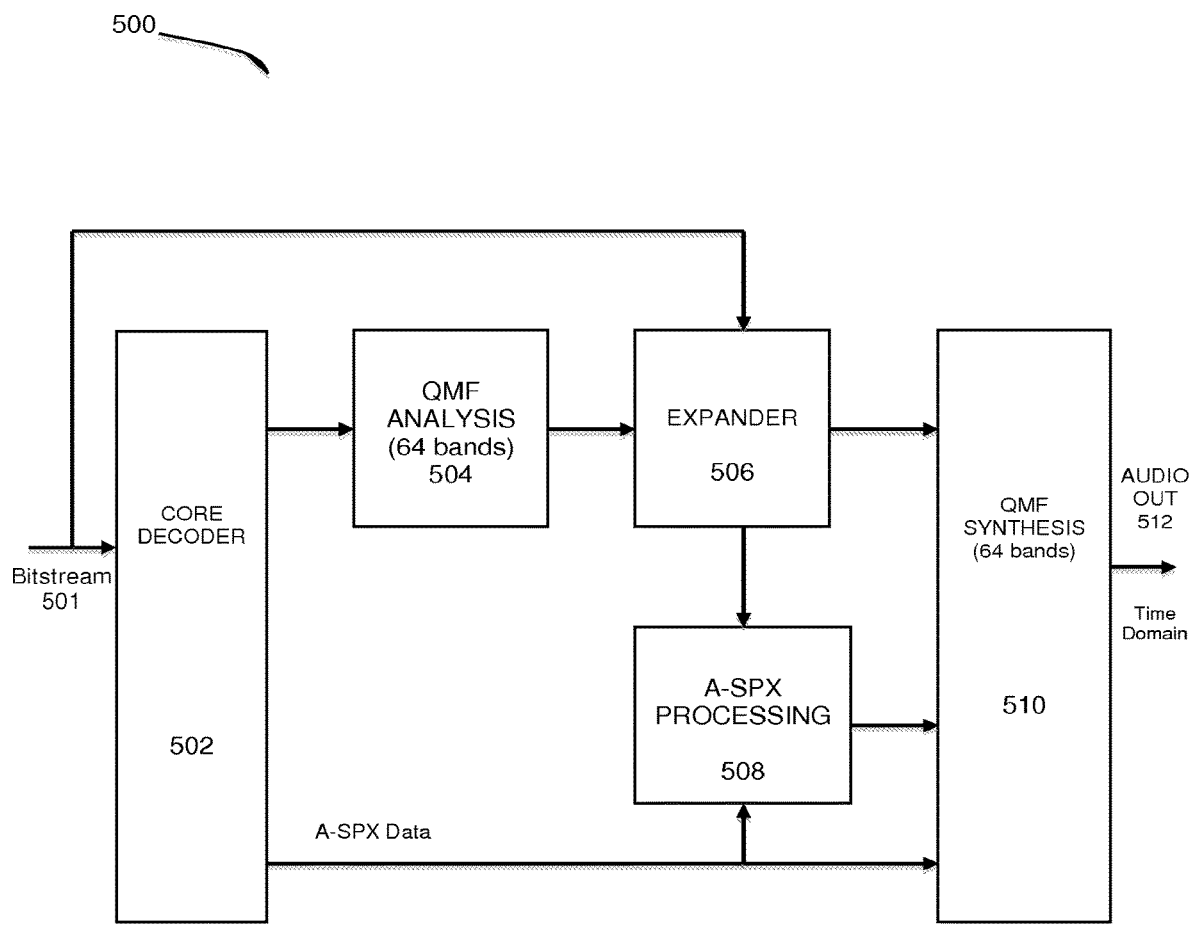
FIG. 5 is a block diagram illustrating a system for expanding an audio signal, under an embodiment.

In a system where both companding and A-SPX are performed in the QMF domain, at the encoder, the A-SPX envelope data for the higher frequencies may be extracted from the yet uncompressed subband samples as shown in FIG. 4, and compression may be applied only to the lower frequency QMF samples that correspond to the frequency range of the signal encoded by the core encoder 412. At the decoder 502 of FIG. 5, after QMF analysis 504 of the decoded signal, the expansion process 506 is applied first, and the A-SPX operation 508 subsequently reproduces the higher subband samples from the expanded signal in the lower frequencies.

In this example implementation, the QMF synthesis filterbank 410 at the encoder and the QMF analysis filterbank at the decoder 504 together introduce 640−64+1 sample delay (~9 QMF slots). The core codec delay in this example is 3200 samples (50 QMF slots), so the total delay is 59 slots. This delay is accounted for by embedding control data into the bitstream and using it at the decoder, so that both the encoder compressor and the decoder expander operations are in sync.

Alternatively, at the encoder, compression may be applied on the entire bandwidth of the original signal. The A-SPX envelope data may be subsequently extracted from the compressed subband samples. In such a case, the decoder, after QMF analysis, first runs the A-SPX tool to first reconstruct the full bandwidth compressed signal. The expansion stage is then applied to recover the signal with its original dynamic range.

Yet another tool that could operate in the QMF domain may be an advanced coupling (AC) tool (not shown) in FIG. 4. In an advanced coupling system, two channels are encoded as a mono downmix with additional parametric spatial information that can be applied in the QMF domain at the decoder to reconstruct a stereo output. When AC and companding are used in conjunction with each other, the AC tool could either be placed after the compression stage 406 at the encoder, in which case it would be applied before the expansion stage 506 at the decoder. Alternatively, the AC side-information could be extracted from the uncompressed stereo signal in which case the AC tool would operate after the expansion stage 506 at the decoder. A hybrid AC mode may also be supported in which AC is used above a certain frequency and discrete stereo is used below this frequency; or alternatively, discrete stereo is used above the certain frequency and AC is used below this frequency.

As shown in FIGS. 3A and 3B, the bitstream transmitted between the encoder stage and the decoder stage of the codec includes certain control data. Such control data constitutes side-information that allows the system to switch between different companding modes. The switching control data (for switching companding on/off) plus potentially some intermediate states may add on the order of 1 or 2 bits per channel. Other control data can include a signal to determine if all the channels of a discrete stereo or multichannel configuration will use common companding gain factors or if they should be calculated independently for each channel. Such data may only require a single extra bit per channel Other similar control data elements and their appropriate bit weights may be used depending on system requirements and constraints.

Detection Mechanism

In an embodiment, a companding control mechanism is included as part of the compression component 104 to provide control of the companding in the QMF-domain. Companding control can be configured based on a number of factors, such as audio signal type. For example, in most applications, companding should be turned on for speech signals and transient signals or any other signals within the class of temporally peaky signals. The system includes a detection mechanism to detect the peakness of a signal in order to help generate an appropriate control signal for the compander function.

In an embodiment, a measure for temporal peakness $TP(k)_{frame}$ is computed over frequency bin k for a given core codec, and is calculated using the following formula:

$$TP(k)_{frame} = \frac{\sqrt{\sqrt{\frac{1}{T}\sum_{t=0}^{T-1}S_t(k)^4}}}{\sqrt{\frac{1}{T}\sum_{t=0}^{T-1}S_t(k)^2}},$$

In the above equation, $S_t(k)$ is the sub-band signal, and T is the number of QMF slots corresponding to one core encoder frame. In an example implementation, the value of T may be 32. The temporal peakness computed per band can be used to classify the sound content into general two categories: stationary music signals, and musical transient signals or speech signals. If the value of $TP(k)_{frame}$ is less than a defined value (e.g., 1.2), the signal in that subband of the frame is likely to be a stationary music signal. If the value of $TP(k)_{frame}$ is greater than this value, then the signal is likely to be musical transient signals or speech signals. If the value is greater than an even higher threshold value (e.g., 1.6), the signal is very likely to be a pure musical transient signal, e.g. castanets. Furthermore, it has been observed that for naturally occurring signals the values of temporal peakness obtained in different bands was more or less similar, and this characteristic could be employed to reduce the number of subbands for which temporal peakness value is to be calculated. Based on this observation, the system may implement one of the following two.

In a first embodiment, the detector executes the following process. As a first step it computes the number of bands that have a temporal peakness greater than 1.6. As a second step it then computes the mean of temporal peakness values of bands where it is less than 1.6. If the number of bands found in the first step is greater than 51, or if the mean value determined in the second step is greater than 1.45, the signal is determined to be a musical transient signal and hence companding should be switched on. Otherwise, it is determined to be a signal for which companding should not be switched on. Such a detector will switch off most of the time for speech signals. In some embodiments, speech signals will usually be coded by a separate speech coder, and so this is not generally a problem. However, in certain cases, it may be desired to switch on the companding function also for speech. In this case, a second type of detector may be preferable.

In an embodiment, this second type of detector executes the following process. As a first step, it computes the number of bands that have a temporal peakness greater than 1.2. In a second step it then computes mean of temporal peakness values of bands where it is less than 1.2. It then applies the following rule: if the result of the first step is greater than 55: turn companding on, if the result of the first step is less than 15: turn companding off; if the result of the first step lies between 15 and 55 and the result of the second step is greater than 1.16: turn companding on; and if the result of the first step lies between 15 and 55 and the result of the second step is less than 1.16: turn companding off. It should be noted that the two types of detectors described only two examples of many possible solutions for a detector algorithm, and other similar algorithms may also or alternatively be used.

The companding control function provided by element 404 of FIG. 4 may be implemented in any appropriate manner to allow companding to be used or not used based on certain operational modes. For example, companding is generally not used on the LFE (low frequency effects) channel of a surround sound system, and is also not used when there is no A-SPX (i.e., no QMF) functionality implemented. In an embodiment, the companding control function may be provided by a program executed by a circuit or processor-based elements, such as companding control element 404. Following is some example syntax of a program segment that can implement companding control, under an embodiment:

```
Companding_control(nCh)
{
    sync_flag=0;
    if (nCh>1){
        sync_flag
    }
    b_needAvg=0
    ch_count=sync_flag?1:nCh
    for (ch=0; ch<ch_count; ch++){
        b_compand_on[ch]
        if (!b_compand_on[ch]){
            b_needAvg=1;
        }
    }
    if (b_needAvg){
        b_compand_avg;
    }
}
```

The sync_flag, b_compand_on[ch], and b_compand_avg flags or program elements may be on the order of 1-bit long, or any other length depending on system constraints and requirements. It should be noted that the program code illustrated above is an example of one way of implementing a companding control function, and other programs or hardware components may be used to implement companding control according to some embodiments.

Although embodiments described so far include the companding process for reducing quantization noise introduced by an encoder in a codec, it should be noted that aspects of such a companding process may also be applied in signal processing systems that do not include encoder and decoder (codec) stages. Furthermore, in the event that the companding process is used in conjunction with a codec, the codec may be transform-based or non transform-based.

Aspects of the systems described herein may be implemented in an appropriate computer-based sound processing network environment for processing digital or digitized audio files. Portions of the adaptive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of compressing an audio signal comprising multiple channels, the method comprising:
receiving a time-frequency tiled representation of the audio signal, wherein the time-frequency tiled representation of the audio signal comprises a division of the audio signal into time slots, wherein each time slot is divided into frequency subbands; and
compressing the time-frequency tiled representation of the audio signal to reduce a dynamic range of the audio signal;
wherein compressing the time-frequency tiled representation of the audio signal comprises:
dividing channels of the audio signal into discrete subsets of channels based on grouping information; and
for each discrete subset of channels:
calculating a shared gain for a time slot of the time-frequency tiled representation of the audio signal; and
applying the shared gain for the time slot to each frequency subband of each channel of the discrete subset of channels.

2. The method of claim 1, wherein the time-frequency tiled representation of the audio signal is a QMF-domain representation.

3. The method of claim 2, wherein a number of frequency subbands in each time-slot of the QMF-domain representation is 64.

4. The method of claim 1, wherein, for time slots of relatively low intensity, applying the shared gain amplifies the audio signal, and for time slots of relatively high intensity, applying the shared gain attenuates the audio signal.

5. The method of claim 1, wherein calculating the shared gain includes reducing an amount of amplification or attenuation applied to the audio signal in response to control information.

6. The method of claim 1, wherein compressing the time-frequency tiled representation of the audio signal is enabled or disabled in response to control information.

7. The method of claim 1, wherein the grouping information indicates that all channels of the audio signal are in one discrete subset of channels.

8. The method of claim 1, wherein the grouping information indicates that each channel of the audio signal is in a different discrete subset of channels.

9. A apparatus for compressing an audio signal comprising multiple channels, the apparatus comprising:
a first interface receiving a time-frequency tiled representation of the audio signal, wherein the time-frequency tiled representation of the audio signal comprises a division of the audio signal into time slots, wherein each time slot is divided into frequency subbands; and
a compressor compressing the time-frequency tiled representation of the audio signal to reduce a dynamic range of the audio signal;
wherein compressing the time-frequency tiled representation of the audio signal comprises:
dividing channels of the audio signal into discrete subsets of channels based on grouping information; and
for each discrete subset of channels:
calculating a shared gain for a time slot of the time-frequency tiled representation of the audio signal; and
applying the shared gain for the time slot to each frequency subband of each channel of the discrete subset of channels.

10. A non-transitory computer readable medium that contains instructions that when executed by one or more processors perform the method of claim 1.

* * * * *

UNITED STATES PATENT AND TRADEMARK OFFICE
CERTIFICATE OF CORRECTION

| | |
|---|---|
| PATENT NO. | : 11,423,923 B2 |
| APPLICATION NO. | : 16/892180 |
| DATED | : August 23, 2022 |
| INVENTOR(S) | : Per Hedelin et al. |

It is certified that error appears in the above-identified patent and that said Letters Patent is hereby corrected as shown below:

In the Claims

Line 10, In Claim 9, delete "A" and insert --An-- therefor.

Signed and Sealed this
Thirtieth Day of July, 2024

Katherine Kelly Vidal
*Director of the United States Patent and Trademark Office*